US012787232B2

(12) United States Patent
Song et al.

(10) Patent No.: US 12,787,232 B2
(45) Date of Patent: Nov. 3, 2026

(54) POWER CONVERSION DEVICE

(71) Applicant: HL MANDO CORPORATION, Pyeongtaek (KR)

(72) Inventors: Sangyoun Song, Pyeongtaek (KR); Hyeonwoo Park, Pyeongtaek (KR)

(73) Assignee: HL Mando Corporation, Pyeongtaek (KR)

( * ) Notice: Subject to any disclaimer, the term of this patent is extended or adjusted under 35 U.S.C. 154(b) by 232 days.

(21) Appl. No.: 18/581,491

(22) Filed: Feb. 20, 2024

(65) Prior Publication Data

US 2025/0024649 A1 Jan. 16, 2025

(30) Foreign Application Priority Data

Jul. 11, 2023 (KR) ........................ 10-2023-0089755

(51) Int. Cl.
*H05K 7/20* (2006.01)
*H02M 3/00* (2006.01)

(52) U.S. Cl.
CPC .......... *H05K 7/2089* (2013.01); *H02M 3/003* (2021.05)

(58) Field of Classification Search
CPC ............................. H05K 7/2089; H02M 3/003
USPC .......................................................... 361/689
See application file for complete search history.

(56) References Cited

U.S. PATENT DOCUMENTS 7,564,129 B2 * 7/2009 Nakanishi ............. H01L 23/473 257/713
2007/0215335 A1 * 9/2007 Chen ................... H01L 23/4093 257/E23.105
2014/0054762 A1 * 2/2014 Nagaune ............... H01L 23/473 257/714
2020/0286812 A1 * 9/2020 Tochiyama ............ H05K 7/209
2022/0377939 A1 11/2022 Uchibe
2023/0044486 A1 * 2/2023 Hanano ................. H01L 23/473

FOREIGN PATENT DOCUMENTS

JP 5114967 B2 1/2013
KR 10-2021-0058074 A 5/2021
KR 10-2023-0040085 A 3/2023

OTHER PUBLICATIONS

Extended European Search Report issued in European Patent Application No. 24163714.9 dated Sep. 6, 2024.

* cited by examiner

*Primary Examiner* — Zhengfu J Feng
(74) *Attorney, Agent, or Firm* — Harvest IP Law, LLP

(57) ABSTRACT

A power conversion device is provided. The power conversion device includes a semiconductor module having a heat dissipation fin; and a flow path through which a coolant flows, allowing the coolant to flow at least at an area where the heat dissipation fin is positioned, wherein the flow path is configured to direct a flow of the coolant upward. According to the present embodiments, it is possible to enhance cooling efficiency, increase power conversion efficiency and performance, as well as the service life of internal elements, and reduce the risk of fire.

19 Claims, 8 Drawing Sheets

POWER CONVERSION DEVICE

CROSS-REFERENCE TO RELATED APPLICATION

This application claims priority from Korean Patent Application No. 10-2023-0089755, filed on Jul. 11, 2023, which is hereby incorporated by reference for all purposes as if fully set forth herein.

BACKGROUND

Field

The present embodiments relate to a power conversion device and, more specifically, to a power conversion device capable of enhancing cooling efficiency, increasing power conversion efficiency and performance, as well as the service life of internal elements, and reducing the risk of fire.

Description of Related Art

An electric vehicle refers to a vehicle that uses electrical energy rather than fossil fuels, and related technologies are developing rapidly in response to the recent depletion of fossil fuels and the trend of developing eco-friendly vehicles.

Electric vehicles that use electricity as an energy source are essentially equipped with high-voltage batteries, and the high-voltage batteries supply the necessary power while repeatedly charging and discharging during driving. A power conversion device is provided to convert the high-voltage power supplied from the battery to a low voltage of the system used in the vehicle.

During the conversion of high-voltage, high-current power, the power conversion device remains in a high-temperature state, which may cause a fire. Thus, the heat dissipation performance of the power conversion device is important. Further, the heat dissipation performance of the power conversion device is of great significance because it affects not only the efficiency and performance of power conversion but also the lifespan of the device.

BRIEF SUMMARY

Conceived in the foregoing background, the present embodiments relate to a power conversion device capable of enhancing cooling efficiency, increasing power conversion efficiency and performance, as well as the service life of internal elements, and reducing the risk of fire.

According to the present embodiments, there may be provided a power conversion device, comprising a semiconductor module having a heat dissipation fin and a flow path through which a coolant flows, allowing the coolant to flow at least at an area where the heat dissipation fin is positioned, wherein the flow path is configured to direct a flow of the coolant upward.

According to the present embodiments, there may be provided a power conversion device, comprising a housing having a flow path through which a coolant flows, wherein the flow path includes a heat exchanger having an opening in an upper portion thereof, and wherein a guide portion obliquely protruding upward is formed on a lower surface of the flow path, a cover covering the upper portion of the heat exchanger, coupled to the housing, and having a communication hole communicating with the heat exchanger, and a semiconductor module coupled to the cover and having a heat dissipation fin inserted to the communication hole.

According to the present embodiments, it is possible to enhance cooling efficiency, increase power conversion efficiency and performance, as well as the service life of internal elements, and reduce the risk of fire.

DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
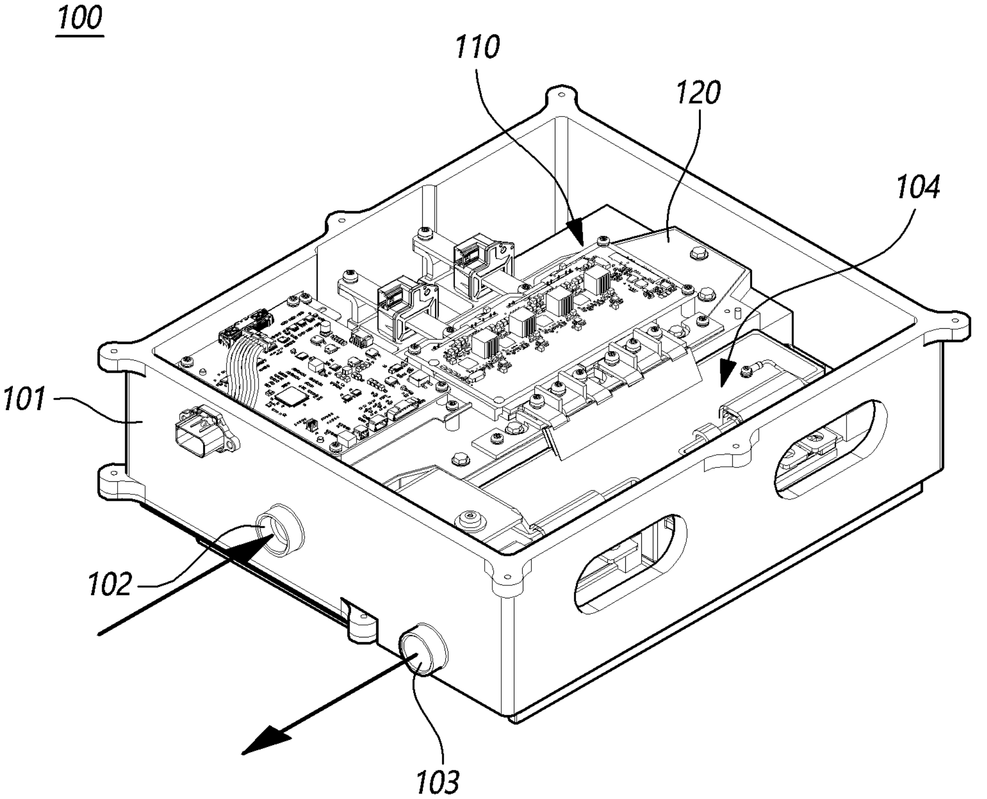
FIG. 1 is a perspective view illustrating a power conversion device according to the present embodiments.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e. g., process factors, internal or external impact, noise, etc.) even when a relevant description is not specified. Further, the term "may" fully encompasses all the meanings of the term "can".

Figure 2:
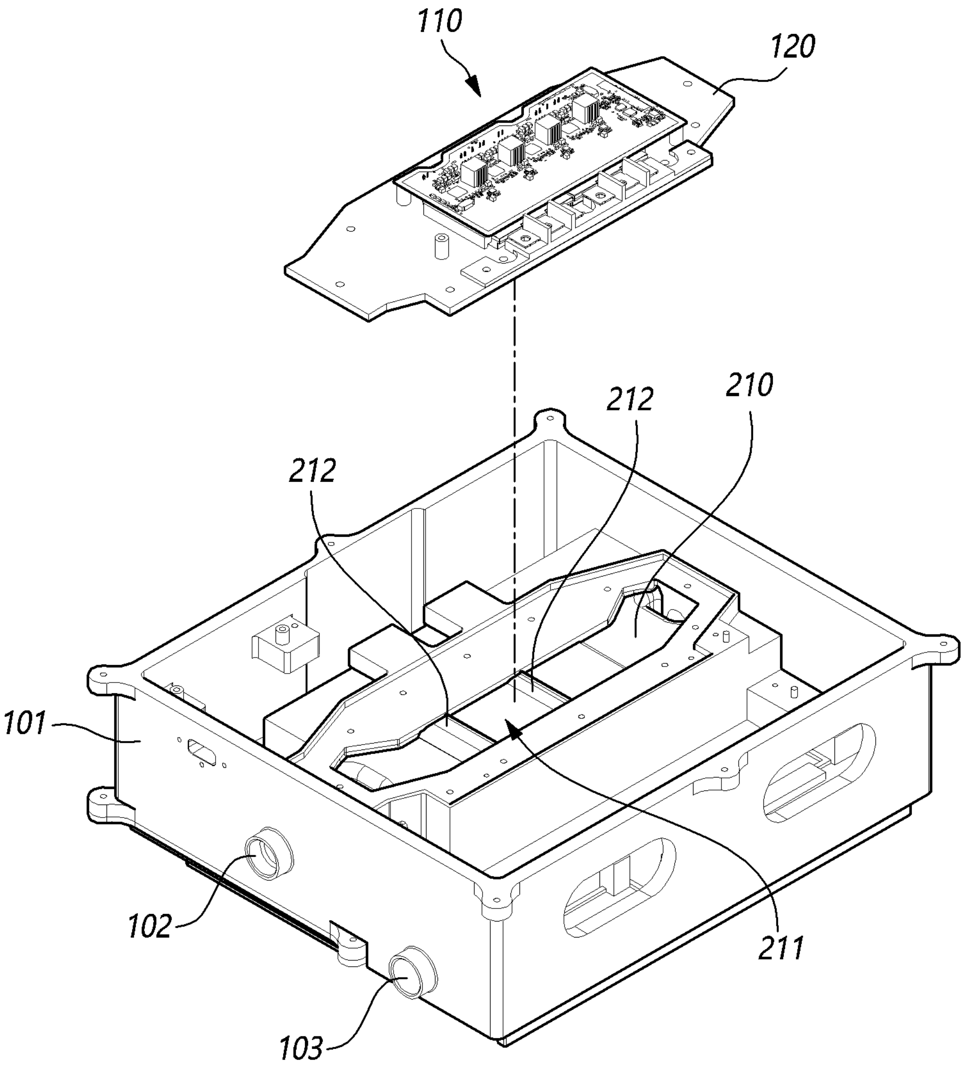
FIG. 2 is an exploded perspective view illustrating a portion of a power conversion device according to the present embodiments.
Figure 3:
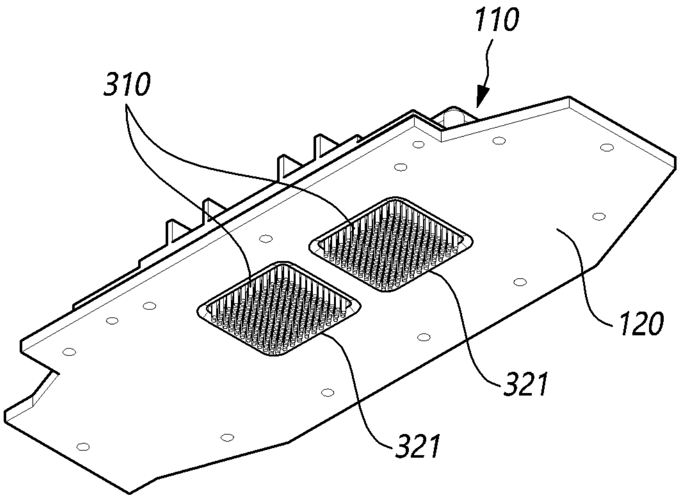
FIG. 3 is a perspective view illustrating a portion of a power conversion device according to the present embodiments.
Figure 4:
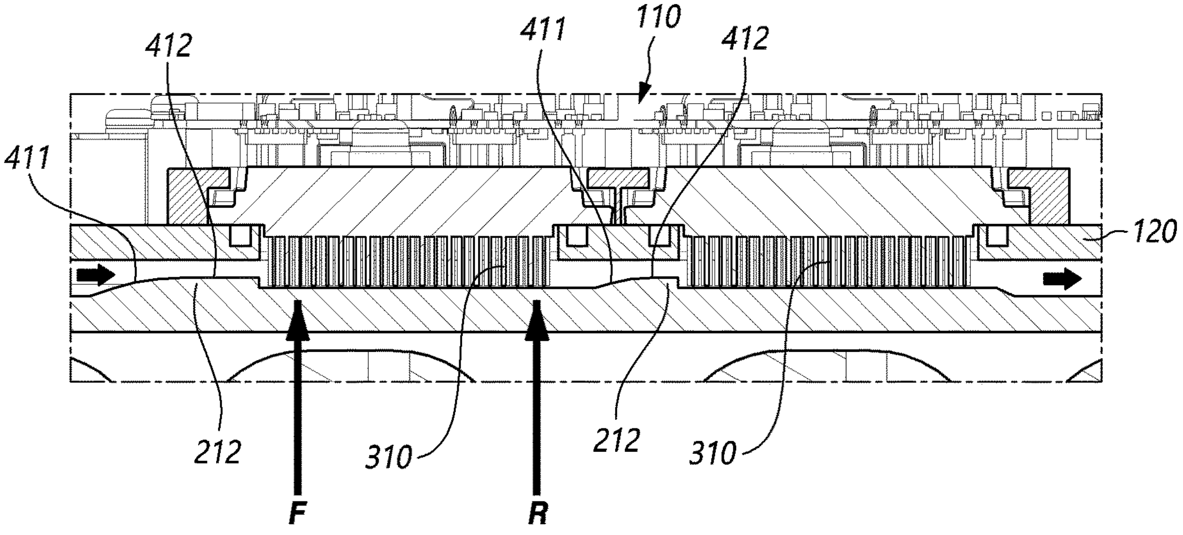
FIG. 4 is a cross-sectional view illustrating a portion of a power conversion device according to the present embodiments.
Figure 5:
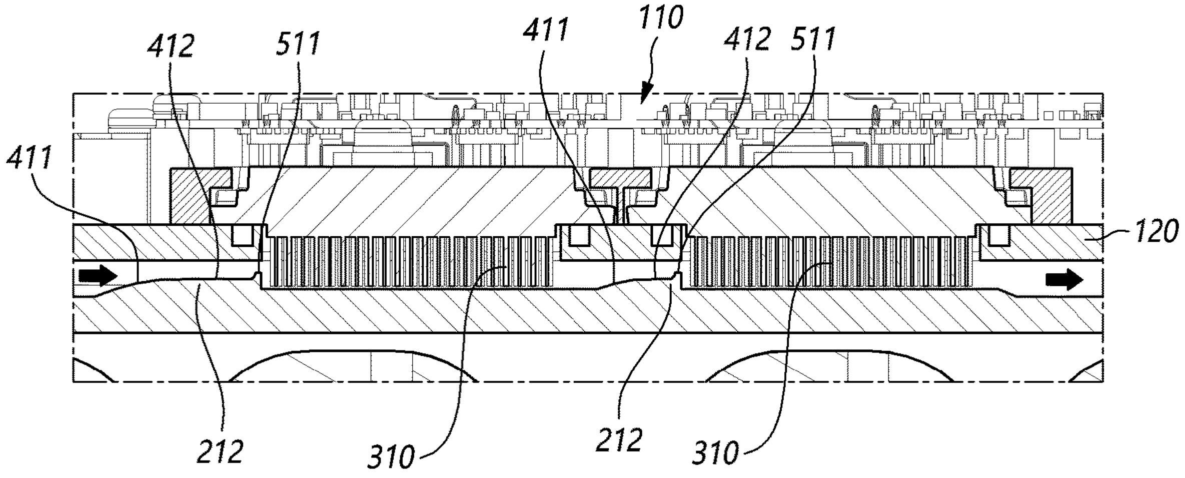
FIG. 5 is a cross-sectional view illustrating a portion of a power conversion device according to the present embodiments.
Figure 6:
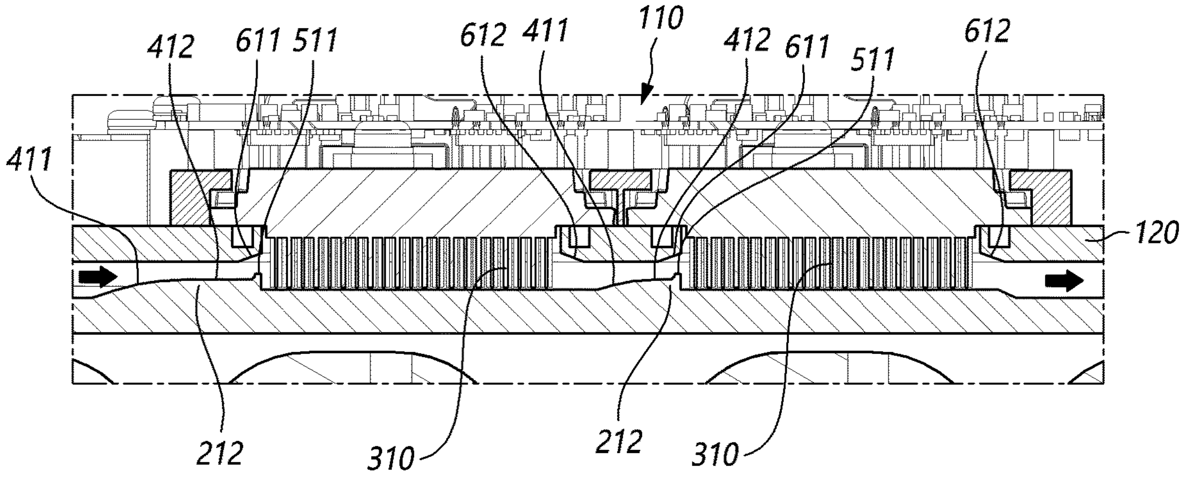
FIG. 6 is a cross-sectional view illustrating a portion of a power conversion device according to the present embodiments.
Figure 7A:
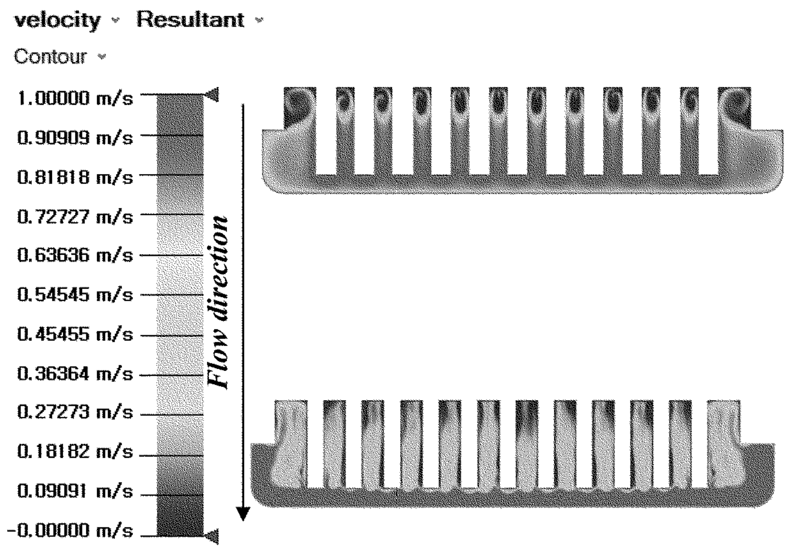
FIG. 7A and FIG. 7B are views illustrating the cooling efficiency of a power conversion device according to the present embodiments.
Figure 7B:
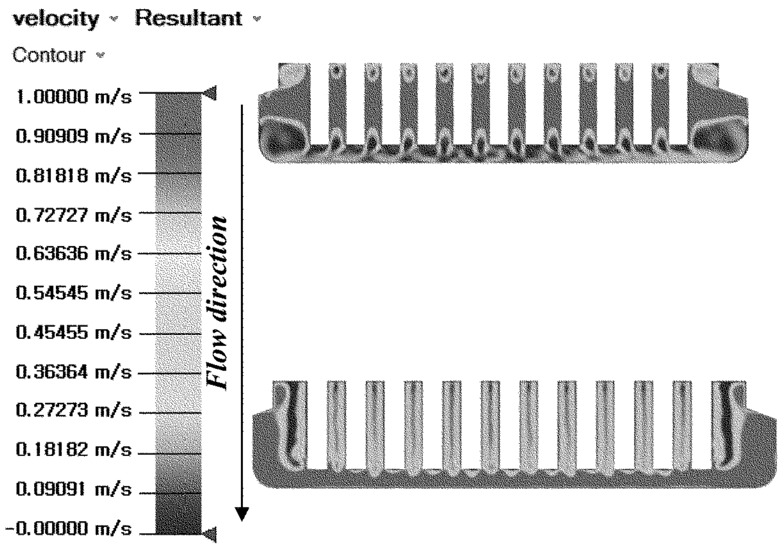

FIG. 1 is a perspective view illustrating a power conversion device according to the present embodiments. FIG. 2 is an exploded perspective view illustrating a portion of a power conversion device according to the present embodiments. FIG. 3 is a perspective view illustrating a portion of a power conversion device according to the present embodiments. FIG. 4 is a cross-sectional view illustrating a portion of a power conversion device according to the present embodiments. FIG. 5 is a cross-sectional view illustrating a portion of a power conversion device according to the present embodiments. FIG. 6 is a cross-sectional view illustrating a portion of a power conversion device according to the present embodiments. FIG. 7A and FIG. 7B are views illustrating the cooling efficiency of a power conversion device according to the present embodiments.

A power conversion device 100 according to the present embodiments includes a semiconductor module 110 having a heat dissipation fin 310 and a flow path 210 through which a coolant flows, allowing the coolant to flow at least at an area where the heat dissipation fin 310 is positioned, wherein the flow path is configured to direct a flow of the coolant directed upward. The power conversion device 100 according to the present embodiments may be a DC-DC converter.

Referring to FIGS. 1 to 3, the power conversion device 100 according to the present embodiments includes a housing 101 and electronic components received inside the housing 101. The housing 101 receives a semiconductor module 110, a capacitor 104, and an inductor (not shown).

The semiconductor module 110 includes a semiconductor device and a heat dissipation fin 310. The semiconductor device of the semiconductor module 110 converts the high-voltage current applied from the battery into a low-voltage current. The power converted by the semiconductor device may be stored as energy in the capacitor 104 and the inductor. As the heat generated from the semiconductor device during power conversion is dissipated through the heat dissipation fin 310, the semiconductor device is cooled down. The semiconductor device may be, e.g., an SiC semiconductor device. The semiconductor device and the heat dissipation fin 310 may constitute a single unit. In the power conversion device 100, a plurality of units, constituted by the semiconductor device and the heat dissipation fin 310, may be provided. As an example, in the drawings of this application, an embodiment in which two semiconductor devices and two heat dissipation fins 310 are provided is illustrated.

A flow path 210 is formed in the housing 101 to cool electronic components received in the housing 101. The flow path 210 may be formed along a length direction L. The housing 101 may feature an inlet 102 through which coolant is introduced and an outlet 103 through which coolant is discharged. The inlet 102 and the outlet 103 may be formed at two opposite ends of the flow path 210. The flow path 210 is formed to cool the semiconductor module 110, capacitor 104, and inductor provided in the housing 101.

The heat dissipation fin 310 of the semiconductor module 110 is disposed on the flow path 210. The heat dissipation fin 310 and the coolant perform heat-exchange to cool the semiconductor module 110. The flow path 210 is formed to have an upper opening in the housing 101, and the upper opening is a heat exchanger 211 where the semiconductor module 110 is cooled. The semiconductor module 110 is positioned at an upper side of and coupled to a cover 120 in the height direction H. The cover 120 covers the heat exchanger 211. The cover 120 has a communication hole 321, and the heat dissipation fin 310 protrudes in the semiconductor module 110, downward of the cover 120 in the height direction H through the communication hole 321. When a plurality of semiconductor devices and a plurality of heat dissipation fins 310 are provided, a corresponding number of communication holes 321 may be provided to accommodate each of them. The heat dissipation fin 310 is positioned to exchange heat with the coolant in the flow path 210 when the cover 120 is coupled to the housing 101, covering the heat exchanger 211.

The flow path 210 is formed to direct the flow of the coolant supplied to an upper side of the heat dissipation fin 310. The cover 120 is coupled to the housing 101 in a manner that covers the heat exchanger 211 from above. The heat dissipation fin 310 is provided to protrude downward of the cover 120 in the height direction H. The coolant supplied from the flow path 210 to the heat dissipation fin 310 is directed to an upper side the heat dissipation fin 310. The coolant flowing in the flow path 210 travels along the direction in which the flow path is formed (i.e., the length direction L) and is directed upward, toward the heat dissipation fin 310 in the heat exchanger 211. Accordingly, the efficiency of heat exchange with the heat dissipation fin 310 is enhanced, leading to higher cooling performance.

FIG. 7A illustrates the flow velocity of the coolant along the flow direction in a conventional power conversion device. FIG. 7B illustrates the flow velocity of the coolant exchanged with the heat dissipation fin 310, along the flow direction, in the power conversion device 100 according to the present embodiments.

The conventional power conversion device has a simple structure in which a heat dissipation fin is provided in the flow path. The difference in flow resistance caused by the presence of the heat dissipation fin leads to non-uniformity in which the flow velocity is higher around the lower end of the heat dissipation fin while the flow velocity is lower around the upper end of the heat dissipation fin. Such flow velocity non-uniformity primarily occurs from a front portion (see reference character F in FIG. 4) of the heat dissipation fin to a rear portion (see reference character R in FIG. 4) of the heat dissipation fin along the flow direction of the coolant (i.e., along the length direction L), causing deterioration of cooling efficiency. In the length direction L, a direction from the inlet 102 towards the heat dissipation fin 310 may be referred to as a rearward direction and a direction opposite to the rearward direction may be referred to as a forward direction.

However, in the power conversion device 100 according to the present embodiments, configuration is designed such that the flow of the coolant supplied to the heat dissipation fin 310 is directed upward. This arrangement ensures uniform flow around the upper end and lower ends of the heat dissipation fin 310 and thus enhances cooling efficiency. Comparison between FIG. 7A and FIG. 7B reveals that the flow velocity from the upper end to lower end of the heat dissipation fin is uniformly distributed as the coolant is provided toward the upper end of the heat dissipation fin by way of a guide portion. It may be identified that the uniformity of flow velocity from the front portion to rear portion of the heat dissipation fin is also enhanced. Accordingly, the power conversion device according to the present embodiments may enhance cooling efficiency and increase the power conversion efficiency and performance of the semiconductor device. By enhancing cooling performance, it is also possible to prevent deterioration of lifespan of the semiconductor device, increase the lifespan, and reduce the risk of fire.

The shape of the flow path of the power conversion device 100 according to the present embodiments is described in greater detail with reference to FIGS. 4 to 6.

Referring to FIG. 4, according to an embodiment, a guide portion 212 is formed on a lower surface of the flow path 210 and is positioned in front of the heat dissipation fin 310, protruding obliquely upward from the lower surface of the heat exchanger 211. The guide portion 212 protrudes with a height from the lower surface of the flow path 210 that increases along the flow direction of the coolant (i.e., along the rearward direction). Accordingly, the coolant flowing in the flow path 210 is rendered to have flow directivity upward by the guide portion 212. As shown in the drawings, the guide portion 212 is positioned in front of the heat dissipation fin 310, directing the flow of coolant upward. The coolant, rendered to have flow directivity upward by the guide portion 212, is provided to the heat dissipation fin 310.

In the case of multiple heat dissipation fins 310, the guide portion 212 may be provided at a position corresponding to each heat dissipation fin 310. When a plurality of guide portions 212 are provided, the coolant supplied to the heat exchanger 211 is given flow directivity upward by the first guide portion, cools the first heat dissipation fin, and is then sequentially given flow directivity upward by the subsequent guide portions to cool the subsequent heat dissipation fins.

According to an embodiment, the upper end of the guide portion 212 may be positioned above the lower end of the heat dissipation fin 310. In other words, with respect to the lower surface of the flow path 210, the height of the guide portion 212 protruding obliquely upward in the height direction H may be positioned above (i.e., may be positioned higher than) the lower end of the heat dissipation fin 310. Accordingly, the coolant given flow directivity upward while being guided by the guide portion 212 is first provided to an upper part of the heat dissipation fin 310. Since the upper part of the heat dissipation fin 310 has higher flow resistance than the lower part thereof, it is possible to further enhance flow velocity uniformity by first supplying the coolant to the upper part of the heat dissipation fin 310.

According to an embodiment, the guide portion 212 may include an inclined portion 411 inclined upward and a flat portion 412 horizontally extending from the upper end of the inclined portion 411. The inclined portion 411 may protrude upward from the lower surface of the flow path 210 while having a gentle inclination. The flat portion 412 may horizontally extend toward the rearward direction from the upper end where the inclination of the inclined portion 411 ends. By the inclination of the inclined portion 411, a breadth of the flow path 210 in the height direction decreases, and flow velocity increases. The coolant with the increased flow velocity flows along the portion where the flat portion 412 is formed while being supplied to the upper end of the heat dissipation fin 310. According to an embodiment, the inclined portion 411 may be shaped as a convex curved surface. The inclined portion 411 may be formed to have a convex curved surface to facilitate upward flow direction of the coolant, and the upper end of the inclined portion 411 is smoothly and seamlessly connected to the flat portion 412.

Referring to FIG. 5, according to an embodiment, the guide portion 212 may include a stepped portion 511 protruding upward from the rear end of the flat portion 412. The stepped portion 511 protrudes from the rear end of the flat portion 412 and increases the upward flow directivity imparted to the coolant by the inclined portion 411. In other words, the coolant flowing along the flat portion 412 is given upward flow directivity one more time at the rear end of the flat portion 412 by the stepped portion 511 and is then supplied to the heat dissipation fin 310. Accordingly, cooling efficiency may further be increased.

According to an embodiment, the stepped portion 511 may be extended from a widthwise end of the flat portion 412 to the other widthwise end in the width direction W. Further, according to an embodiment, the stepped portion 511 may have a constant height. In other words, the height of the stepped portion 511 along the width direction W may be constant. However, the protruding height of the stepped portion 511 needs to be formed not to impede the flow of the coolant, and is preferably smaller than the height of the inclined portion 411. The entire coolant flowing in the flow path 210 is uniformly directed upward by the stepped portion 511, thereby making it possible to suppress formation of an eddy that could otherwise lead to a decline in cooling efficiency.

According to an embodiment, the front surface of the stepped portion 511 may be connected to the flat portion 412 through a curved surface. The curved surface at the front of the stepped portion 511 may be a convex curved surface or a concave curved surface. In other words, the stepped portion 511 may protrude with an incline connected to the rear end of the flat portion 412, and the front surface of the incline connected to the flat portion 412 may be shaped as a concave surface. As the front surface of the stepped portion 511 is shaped as a concave surface, the acceleration of the upward flow directivity by the stepped portion 511 may be maximized although the stepped portion 511 has a smaller height.

Referring to FIG. 6, according to an embodiment, a first inclined surface 611 may be formed at a lower surface of the cover 120 to minimize deterioration of fluidity of the coolant caused by the stepped portion 511. In other words, the first inclined surface 611 may be formed in the lower surface of the cover 120 and has an inclination upward toward the flow direction (i.e., the rearward direction). The first inclined surface 611 may be positioned ahead of the communication hole 321. The first inclined surface 611 is connected to the communication hole 321. The first inclined surface 611 may be positioned above the stepped portion 511. Therefore, when upward flow directivity is given to the coolant one more time by the stepped portion 511, it becomes possible to secure a cross-sectional area of the flow path 210 by having the first inclined surface 611, thereby preventing any deterioration of the coolant fluidity. The cross-sectional area that is secured in the manner means a cross-sectional area of the flow path 210 when the flow path 210 is viewed in the length direction L.

Further, the cover 120 may have a second inclined surface 612 to secure optimal fluidity of the coolant after heat exchange with the heat dissipation fin 310. In other words, the second inclined surface 612 may be formed in the lower surface of the cover 120 and has an inclination downward toward the flow direction (i.e., the rearward direction). The second inclined surface 612 may be positioned behind the communication hole 321. The second inclined surface 612 is connected to the communication hole 321. By providing a flow space of the coolant, via the second inclined surface 612, at the rear of the upper end of the heat dissipation fin 310, where flow resistance is higher, the fluidity of the coolant may be secured after exchanging heat with the heat dissipation fin 310.

A power conversion device 100 according to the present embodiments includes a housing 101 having a flow path 210 to which a coolant is introduced, wherein the flow path 210 includes a heat exchanger 211 having an opening in an upper portion thereof, and wherein a guide portion 212 obliquely protruding upward is formed on a lower surface of the heat exchanger 211, a cover 120 covering the upper portion of the heat exchanger 211, coupled to the housing 101, and having a communication hole 321 communicating with the heat exchanger 211, and a semiconductor module 110 coupled to the cover 120 and having a heat dissipation fin 310 inserted to the communication hole 321. With reference to FIGS. 1 to 7, the same matters as those in the above-described embodiments are briefly described using the same reference numerals.

According to an embodiment, the heat dissipation fin 310 may be positioned behind (i.e., at a rear side) the guide portion 212 in the heat exchanger 211. The heat dissipation fin 310 is inserted to the communication hole 321 in the downward direction and positioned on the flow path 210. The heat dissipation fin 310 is positioned behind the guide portion 212 to receive the coolant directed upward by the guide portion 212.

According to an embodiment, the upper end of the guide portion 212 may be positioned at a higher position than the lower end of the heat dissipation fin 310.

According to an embodiment, the guide portion 212 may include an inclined portion 411 inclined upward toward the flow direction (i.e., toward the rearward direction) and a flat portion 412 horizontally extending from the upper end of the inclined portion 411.

According to an embodiment, the inclined portion 411 may be shaped as a convex surface.

According to an embodiment, the guide portion 212 may include a stepped portion 511 protruding upward from the rear end of the flat portion 412.

According to an embodiment, the stepped portion 511 may be formed from a widthwise end of the flat portion 412 to the other widthwise end.

According to an embodiment, the stepped portion 511 may have a constant height along the width direction W.

According to an embodiment, the front surface of the stepped portion 511 may be connected to the flat portion 412 through a curved surface. The curved surface at the front of the stepped portion 511 may be a convex curved surface or a concave curved surface.

According to an embodiment, the first inclined surface 611 may be formed in the lower surface of the cover 120 at a position ahead of the communication hole 321. The first inclined surface 611 has an inclination upward in the flow direction (i.e., the rearward direction).

According to an embodiment, the second inclined surface 612 may be formed in the lower surface of the cover at a position behind the communication hole 321. The second inclined surface 612 has an inclination downward in the flow direction (i.e., the rearward direction).

By the so-shaped power conversion device, it is possible to enhance cooling efficiency, increase power conversion efficiency and performance, as well as the service life of internal elements, and reduce the risk of fire.

The above-described embodiments are merely examples, and it will be appreciated by one of ordinary skill in the art various changes may be made thereto without departing from the scope of the disclosure. Accordingly, the embodiments set forth herein are provided for illustrative purposes, but not to limit the scope of the disclosure, and should be appreciated that the scope of the disclosure is not limited by the embodiments. The scope of the disclosure should be construed by the following claims, and all technical spirits within equivalents thereof should be interpreted to belong to the scope of the disclosure. Also, it is noted that any one feature of an embodiment of the present disclosure described in the specification may be applied to another embodiment of the present disclosure. Similarly, the present invention encompasses any embodiment that combines features of one embodiment and features of another embodiment.

What is claimed is:

1. A power conversion device, comprising:

a housing having a flow path through which a coolant flows, wherein the flow path includes heat exchanger having an opening in an upper portion thereof, and wherein a guide portion obliquely protruding upward is formed on a lower surface of the flow path;

a cover covering the upper portion of the heat exchanger, coupled to the housing, and having a communication hole communicating with the heat exchanger; and a semiconductor module coupled to the cover and having a heat dissipation fin inserted into the communication hole, wherein an inclined surface is formed on a lower surface of the cover and is positioned behind the communication hole and inclined downward toward a flow direction of the coolant.

2. The power conversion device of claim 1, wherein the guide portion is formed at a position ahead of the heat dissipation fin and obliquely protrudes upward toward a flow direction of the coolant.

3. The power conversion device of claim 2, wherein an upper end of the guide portion is positioned higher than a lower end of the heat dissipation fin.

4. The power conversion device of claim 2, wherein the guide portion includes an inclined portion inclined upward and a flat portion horizontally extending in the flow direction from an upper end of the inclined portion.

5. The power conversion device of claim 4, wherein the guide portion includes a stepped portion protruding upward from a rear end of the flat portion.

6. The power conversion device of claim 5, wherein the stepped portion is formed extending in a width direction from one widthwise end of the flat portion to other widthwise end of the flat portion.

7. The power conversion device of claim 6, wherein the stepped portion has a constant height.

8. The power conversion device of claim 5, wherein a front surface of the stepped portion is connected to the flat portion through a concave surface.

9. The power conversion device of claim 4, wherein the inclined portion is formed as a convex curved surface.

10. A power conversion device, comprising:

a housing having a flow path through which a coolant flows, wherein the flow path includes a heat exchanger having an opening in an upper portion thereof, and wherein a guide portion obliquely protruding upward is formed on a lower surface of the flow path;

a cover covering the upper portion of the heat exchanger, coupled to the housing, and having a communication hole communicating with the heat exchanger; and a semiconductor module coupled to the cover and having a heat dissipation fin inserted into the communication hole, wherein a first inclined surface is formed on a lower surface of the cover and is positioned ahead of the communication hole and inclined upward toward a flow direction of the coolant.

11. The power conversion device of claim 10, wherein the heat dissipation fin is positioned behind the guide portion in the heat exchanger.

12. The power conversion device of claim 10, wherein an upper end of the guide portion is positioned higher than a lower end of the heat dissipation fin.

13. The power conversion device of claim 10, wherein the guide portion includes an inclined portion inclined upward toward the flow direction of the coolant and a flat portion horizontally extending from an upper end of the inclined portion in the flow direction.

14. The power conversion device of claim 13, wherein the inclined portion is formed as a convex curved surface.

15. The power conversion device of claim 13, wherein the guide portion includes a stepped portion protruding upward from a rear end of the flat portion.

16. The power conversion device of claim 15, wherein the stepped portion is formed extending in a width direction from one widthwise end of the flat portion to other widthwise end of the flat portion.

17. The power conversion device of claim 16, wherein the stepped portion has a constant height along the width direction.

18. The power conversion device of claim 15, wherein a front surface of the stepped portion is connected to the flat portion through a concave surface.

19. The power conversion device of claim 10, wherein a second inclined surface is formed on the lower surface of the cover and is positioned behind the communication hole and inclined downward toward the flow direction of the coolant.

* * * * *